United States Patent [19]

Shibata

[11] Patent Number: 4,577,395
[45] Date of Patent: Mar. 25, 1986

[54] METHOD OF MANUFACTURING SEMICONDUCTOR MEMORY DEVICE HAVING TRENCH MEMORY CAPACITOR

[75] Inventor: Tadashi Shibata, Yokohama, Japan

[73] Assignee: Kabushiki Kaisha Toshiba, Kawasaki, Japan

[21] Appl. No.: 681,129

[22] Filed: Dec. 13, 1984

[30] Foreign Application Priority Data

Jan. 13, 1984 [JP] Japan .................................. 59-4364

[51] Int. Cl.$^4$ ...................... H01L 27/10; H01L 29/78
[52] U.S. Cl. ................... 29/576 C; 29/576 W; 29/580; 29/571; 148/DIG. 14; 148/DIG. 50; 148/DIG. 168; 357/51
[58] Field of Search ............... 29/576 W, 580, 576 C, 29/571; 148/DIG. 14, DIG. 50, DIG. 168; 357/47, 51, 55

[56] References Cited

U.S. PATENT DOCUMENTS 4,327,476  5/1982  Iwai ........................................ 29/571
4,331,708  5/1982  Hunter ................................. 156/643

FOREIGN PATENT DOCUMENTS 85988   8/1983  European Pat. Off. .............. 29/571
69589   1/1977  Japan .................................... 357/51
137245  8/1983  Japan .................................... 29/571

OTHER PUBLICATIONS

H. Sunami et al, Hitachi Ltd., Nikkei Electronics, Dec. 20, 1982, pp. 74-75, FIG. 1 in p. 74.

Primary Examiner—Brian E. Hearn
Assistant Examiner—John T. Callahan
Attorney, Agent, or Firm—Oblon, Fisher, Spivak, McClelland & Maier

[57] ABSTRACT

A method of manufacturing a semiconductor memory device having a trench memory capacitor. First masks are formed on an element forming region of a semiconductor substrate formed of the element forming region and an element isolation region. A film formed of a different material from that of the first masks is deposited and is etched by anisotropic dry etching to leave second masks around the first mask. The semiconductor substrate is selectively etched using the first and second masks as an etching mask so as to form a first groove in the element isolation region. An insulation film is buried in the first groove. A portion of the first mask, formed at least above memory capacitor forming regions in the element forming region, is removed by etching, thereby forming a third mask on a portion excluding the memory capacitor forming region. The semiconductor substrate is selectively etched by using the second and third masks and the insulation film buried in the first groove as an etching mask so as to form second grooves in the respective memory capacitor forming regions. A distance between the first and second grooves is defined by the second masks in a self-alignment manner. A capacitor electrode is formed in the second grooves through a gate insulation film.

6 Claims, 39 Drawing Figures

METHOD OF MANUFACTURING SEMICONDUCTOR MEMORY DEVICE HAVING TRENCH MEMORY CAPACITOR

BACKGROUND OF THE INVENTION

The present invention relates to a method of manufacturing a dynamic semiconductor memory device in which a trench is provided in a memory capacitor region, thereby providing a highly integrated, high-performance device.

A dynamic memory cell consisting of one memory capacitor and one switching transistor can be highly integrated, and can be widely used in memory elements. However, when a unit area of one cell is decreased in accordance with high integration, an area of a memory capacitor is also decreased, thereby considerably decreasing an amount of electrical charge stored in the capacitor. For this reason, recent memory cells have the problems that wrong memory contents are undesirably read out, and the memory contents are destroyed by an electrical charge generated by radiation such as by α-rays. In order to solve such problems, a method is disclosed in NIKKEI ELECTRONICS, Dec. 20, 1982, pp. 74–75, "Test Manufacture of a Trench Capacitor Cell Suitable for a Large-Capacity Dynamic RAM", wherein a trench is formed in a surface of a memory capacitor portion of a substrate, and an area of the surface of a memory capacitor is increased to increase the capacitance, thereby increasing the amount of a stored electrical charge.

However, this memory structure also has a problem. Since an opening of a mask for forming a trench is formed by mask alignment, an opening cannot be formed into a precise shape in a small memory cell. As a result, an area of a side wall portion of the trench cannot be increased, and therefore, a memory cell having a sufficiently large capacitance cannot be formed. In addition, if the width of an element isolation region becomes narrow, a punch through phenomenon is generated between trenches of memory capacitors adjacent to the region, thereby losing electrical charge and causing data error. In order to prevent this punch through phenomenon, the distance between each adjacent memory cell must be increased, thereby preventing high-integration.

SUMMARY OF THE INVENTION

It is an object of the present invention to provide a method of manufacturing a semiconductor memory device having a trench memory capacitor suitable for micropatterning.

It is another object of the present invention to provide a method of manufacturing a semiconductor memory device having a trench memory capacitor which can prevent a punch through phenomenon between two adjacent memory capacitors.

In order to achieve the above objects, there is provided a method of manufacturing a semiconductor memory device, according to the present invention, which comprises the steps of:
forming a first mask in an element forming region of a semiconductor substrate formed of said element forming region and an element isolation region;
depositing a film formed of a material different from that of said first mask on an entire surface of the resultant structure, and etching said film by anisotropic dry etching so as to leave said film around said first mask as a second mask;
selectively etching said semiconductor substrate using said first and second masks as an etching mask so as to form a first groove in said element isolation region;
burying an insulation film in said first groove;
etching said first mask at least above a memory capacitor forming region in said element forming region so as to form a third mask on a portion excluding said memory capacitor forming region;
selectively etching said semiconductor substrate by using said second and third masks, and said insulation film buried in said first groove, as an etching mask so as to form a second groove in said memory capacitor forming region, thereby defining the distance between said first and second grooves by said second mask in a self-aligning manner; and
forming a capacitor electrode in said second groove through a gate insulation film.

According to the present invention, the distance between a first groove formed in an element isolation region and a second groove formed in a memory capacitor forming region is defined by a second mask formed by a process of leaving the side walls in a self-aligning manner, resulting in micropatterning of a memory cell. Furthermore, an element isolation region can be minimized, and the second groove formed in the memory capacitor forming region can be maximized so as to increase the capacitance of a capacitor, thereby improving the characteristics of a micropatterned memory cell.

In addition, if the first groove is formed to be deeper than the second groove, a punch through phenomenon between two adjacent memory capacitors can be prevented.

Furthermore, the first or second groove can be formed as a V-groove, for example, to be inclined with respect to a major surface of the structure. In this structure, ion-implantation for preventing polarity inversion can be easily performed in the element isolation region, and the punch through phenomenon between the two adjacent memory capacitors can be effectively prevented.

BRIEF DESCRIPTION OF THE DRAWINGS

Other objects and advantages will be apparent from the following description taken in conjunction with the accompanying drawings in which.

DETAILED DESCRIPTION OF THE PREFERRED EMBODIMENTS

Figure 1A:
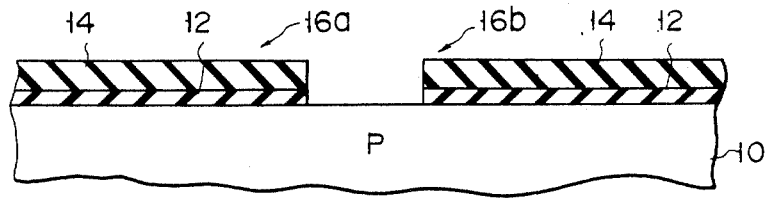
FIGS. 1A to 1G are sectional views respectively showing a manufacturing process according to a first embodiment of a method of manufacturing a semiconductor memory device of the present invention.

A first embodiment of the present invention will be described with reference to FIGS. 1A to 1G and FIGS. 2A to 2C. As shown in FIGS. 1A and 2A, a multilayer film formed of, e.g., a silicon oxide film 12 and a silicon nitride film 14 is formed on a p-type silicon substrate 10. This multilayer film is patterned into a predetermined shape and first masks 16a and 16b are formed on an element forming region of the substrate 10. This patterning is preferably performed by anisotropic dry etching such as reactive ion etching (RIE), ion-milling, or sputtering. It should be noted that a film formed in this step is not limited to the above-mentioned film, but can be a film of any material suitable for use as a mask in the following etching step of the silicon substrate 10. Therefore, the first mask not only may be formed of an $SiO_2$ or $Si_3N_4$ film, but also may be formed of an $Al_2O_3$, Al, or polysilicon film or can be a multilayer thereof. When the first mask is formed of a polysilicon film, at least an upper surface thereof must be covered with another material such as a thermal oxide film. This is because the first mask must serve as a mask when the silicon substrate is etched in the following step. Furthermore, the multilayer used in this step has a thickness of about 0.3 to 1 μm, but is not limited to this thickness.

Figure 1B:
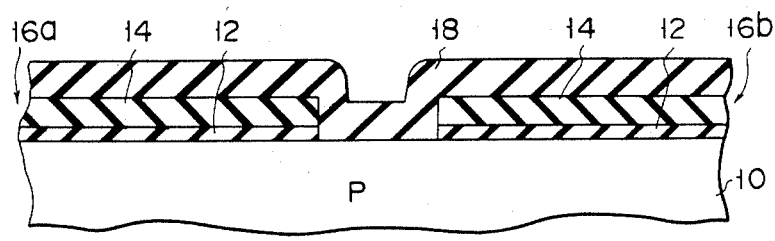
Figure 1C:
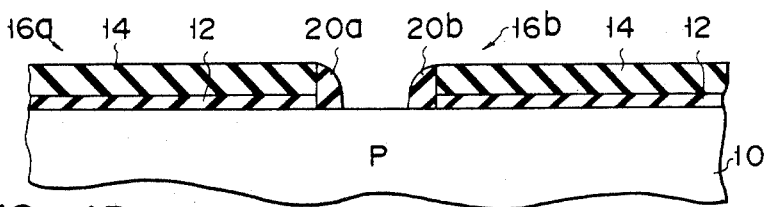
Figure 2A:
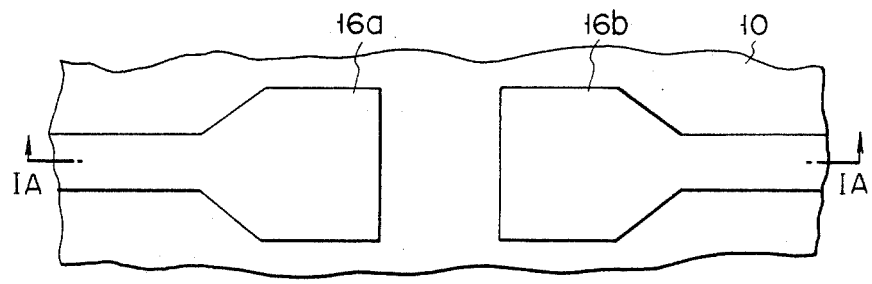
FIG. 2A is a plan view corresponding to FIG. 1A.
Figure 2B:
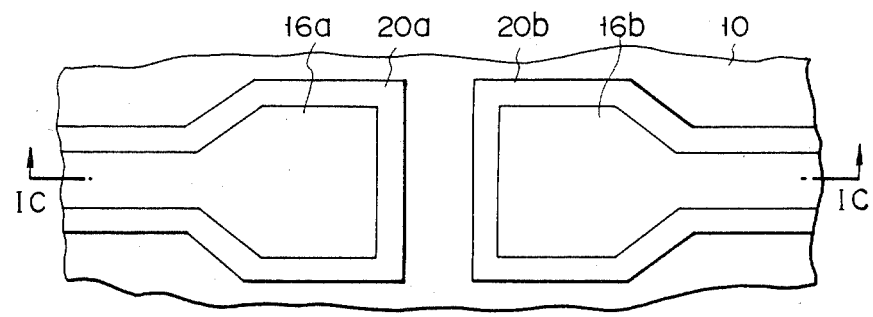
FIG. 2B is a plan view corresponding to FIG. 1C.

As shown in FIG. 1B, for example, a CVD-$SiO_2$ film 18 is deposited on an entire surface of the resultant structure to have a thickness of 0.3 to 0.5 μm. Then, the entire surface of the CVD-$SiO_2$ film 18 is subjected to RIE using, e.g., $CF_4$ and $H_2$ so as to respectively leave second masks 20a and 20b having a thickness of 0.3 to 0.5 μm around the first masks 16a and 16b, which have already been patterned (FIGS. 1C and 2B). Note that the first and second masks must be formed of materials having different etching characteristics.

Figure 1D:
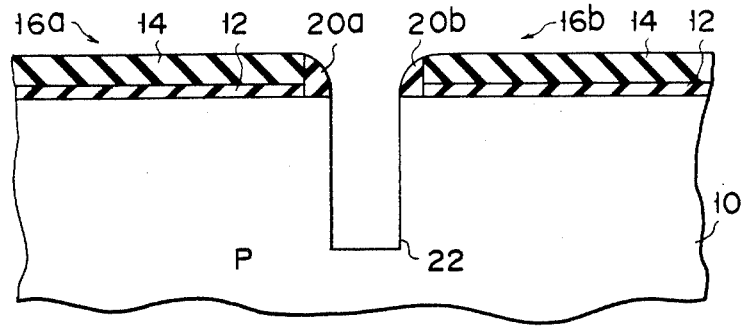

As shown in FIG. 1D, the silicon substrate 10 is etched by RIE using the first masks 16a and 16b and second masks 20a and 20b as an etching mask so as to form a first groove 22 having a depth of 1 to 2 μm in the element isolation region. An inversion preventing layer is formed on a surface of the first groove 22.

Figure 1E:
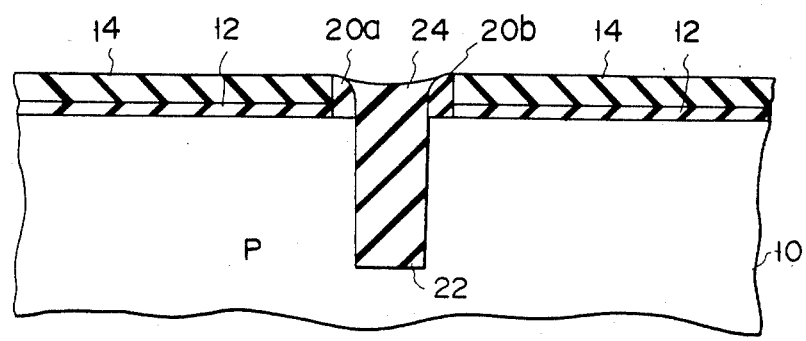

As shown in FIG. 1E, a CVD-$SiO_2$ film 24 is buried in the first groove 22. In this burying step, a flattening technique using etch-back or another burying technique can be used. Furthermore, the silicon substrate 10 can be thermally oxidized to form an $SiO_2$ film.

Figure 1F:
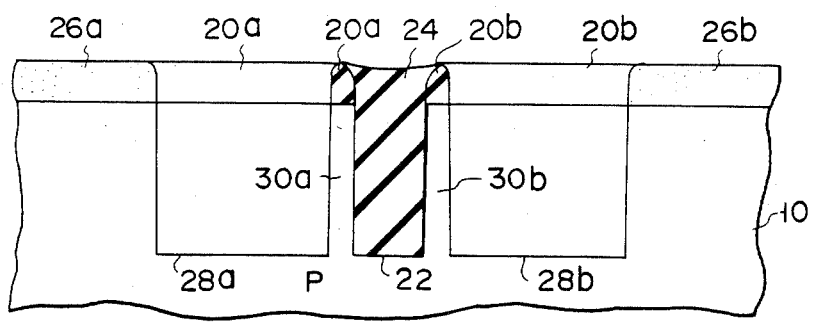
Figure 2C:
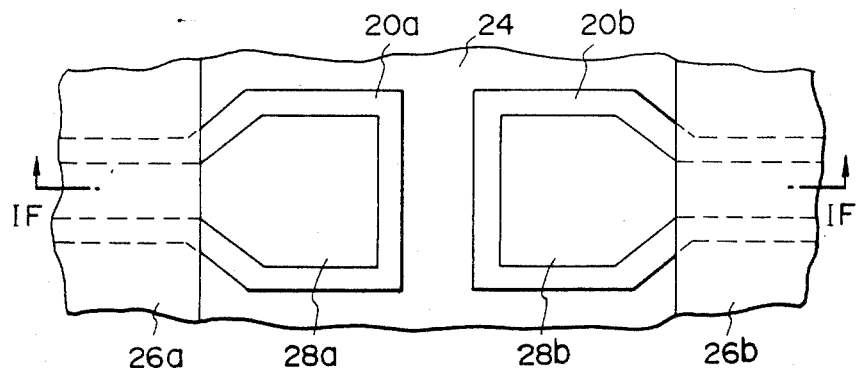
FIG. 2C is a plan view corresponding to FIG. 1F.
Figure 3A:
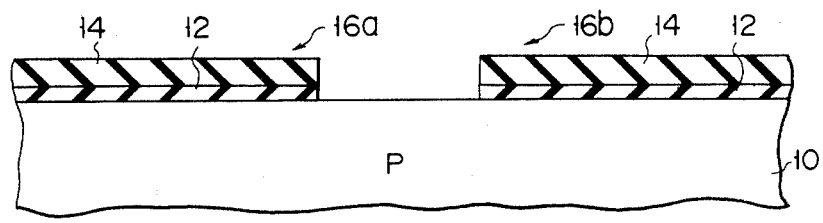
FIGS. 3A to 3G are sectional views for explaining a method of manufacturing a semiconductor memory device according to a second embodiment of the present invention.
Figure 3B:
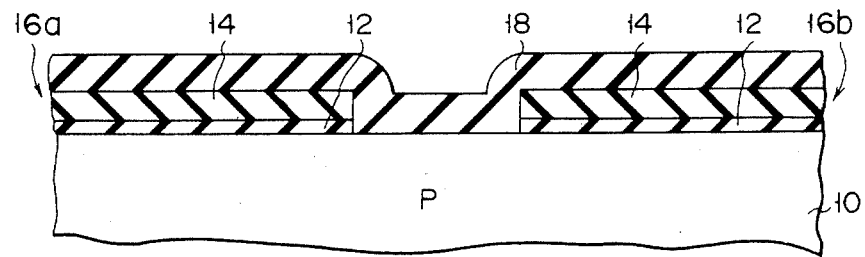
Figure 3C:
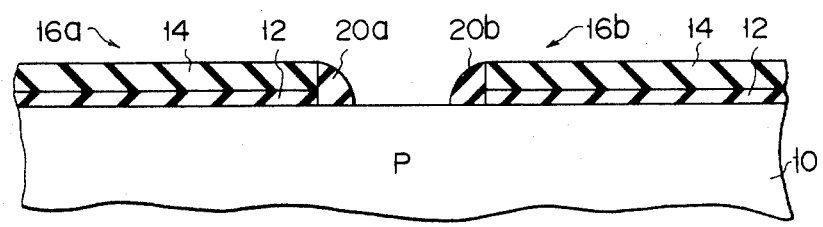
Figure 3D:
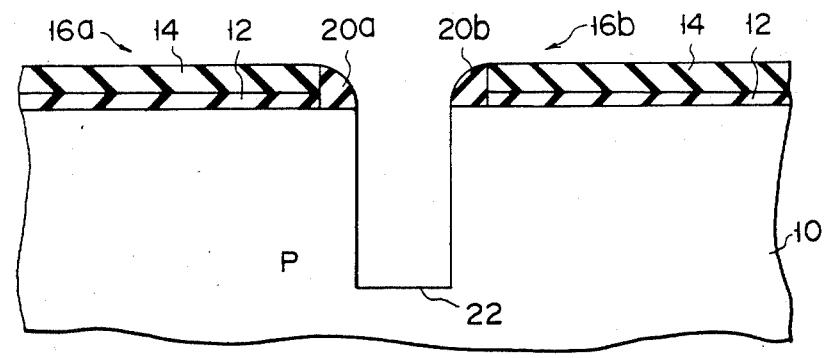
Figure 3E:
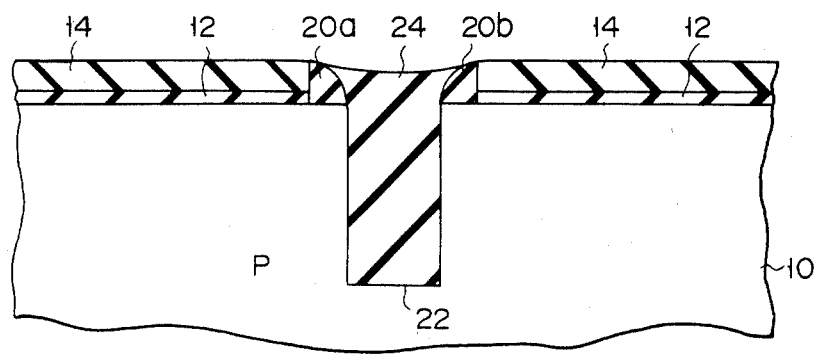
Figure 3F:
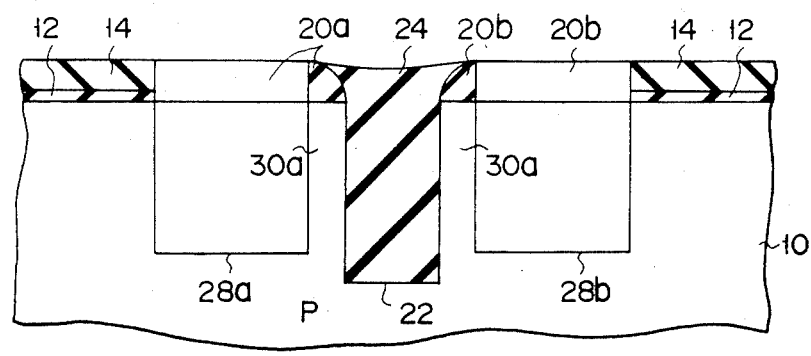
Figure 3G:
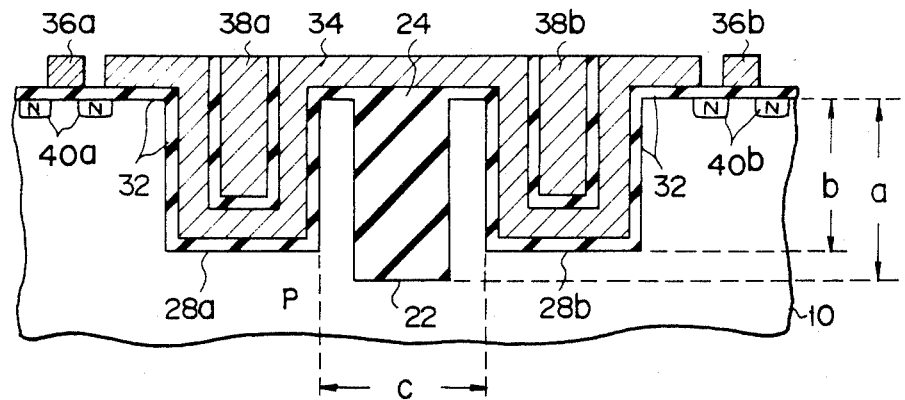

Next, the silicon nitride film 14 constituting the first mask is selectively removed by plasma etching using $CF_4$ and $O_2$. Furthermore, the $SiO_2$ film 12, which has been formed under the silicon nitride film 14, is selectively removed by etching using $NH_4F$ or RIE. Thereafter, photoresists 26a and 26b are formed on portions excluding memory capacitor forming regions. The substrate 10 is etched by RIE using the photoresists 26a and 26b, the second masks 20a and 20b, and the buried CVD-$SiO_2$ film 24 as an etching mask so as to form second grooves 28a and 28b in the memory capacitor forming regions (FIGS. 1F and 2C). As is apparent from the figures, the second grooves 28a and 28b in the memory capacitor forming regions and the first groove 22 formed in the element isolation region are isolated from each other by thin walls 30a and 30b having a thickness of 0.3 to 0.5 μm, which are respectively self-aligned by the second masks 20a and 20b.

In this embodiment, the photoresists 26a and 26b are directly formed on the substrate 10. However, the photoresists 26a and 26b can be formed on the substrate 10 through an $SiO_2$ film, and a mask material other than a photoresist can be used. For example, the first masks 16a and 16b are selectively etched to remove portions corresponding to the memory capacitor forming regions. Then, the residual first masks can be used as an etching mask instead of the photoresists 26a and 26b.

Figure 1G:
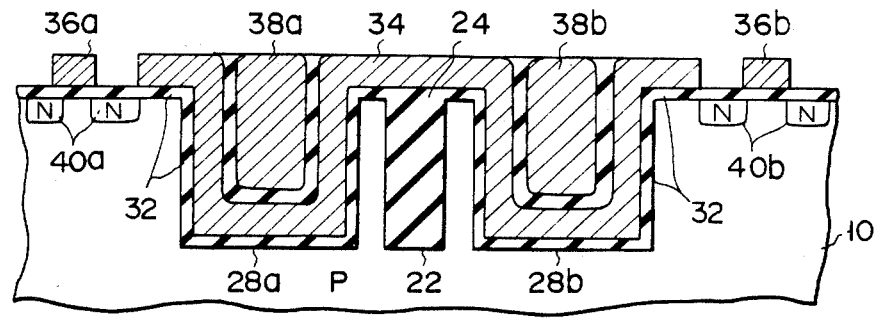

Thereafter, as shown in FIG. 1G, the photoresists 26a and 26b are removed. Then, a polysilicon film is deposited on the element forming region through a gate insulation film 32 formed of a thermal oxide film. This polysilicon film is patterned to form a capacitor electrode 34. Furthermore, gate electrodes 36a and 36b of a switching transistor coupled to a memory capacitor are formed. Arsenic is ion-implanted in the resultant structure at an acceleration voltage of 50 KeV and a dose of $10^{15}$ to $10^{16}$ cm$^{-2}$ using the gate electrodes 36a and 36b and the capacitor electrode 34 as a mask, thereby forming n-type layers 40a and 40b which respectively serve as source and drain regions of the switching transistor. After forming the capacitor electrode 34, polysilicon layers 38a and 38b are buried in recessed portions of the memory capacitor regions. This is done merely to flatten the surface of the device, and so the layers 38a and 38b are not absolutely necessary.

According to the method of this embodiment, since the second masks 20a and 20b are formed in self-alignment without using mask alignment, sufficiently large grooves can be formed. Therefore, the capacitance of the memory capacitor can be sufficiently large. Since the second grooves 28a and 28b are isolated by the buried $SiO_2$ film 24, the punch through phenomenon, in which transfer of electrical charge occurs between the second grooves 28a and 28b, can be prevented. For this reason, the distance between two adjacent cells can be minimized, resulting in high integration. As described above, according to the present invention, characteristics and reliability of the memory cell can be improved and a highly integrated memory cell can be realized.

A second embodiment of the present invention of a manufacturing method of a semiconductor memory device will be described with reference to FIGS. 3A to 3G. In this embodiment, a first groove 22 is formed to be deeper than second grooves 28a and 28b. Since the rest of the structure is the same as that of the first embodiment, the same reference numerals as in the first embodiment denote the same parts in the second embodiment, and a detailed description thereof is omitted.

Figure 4:
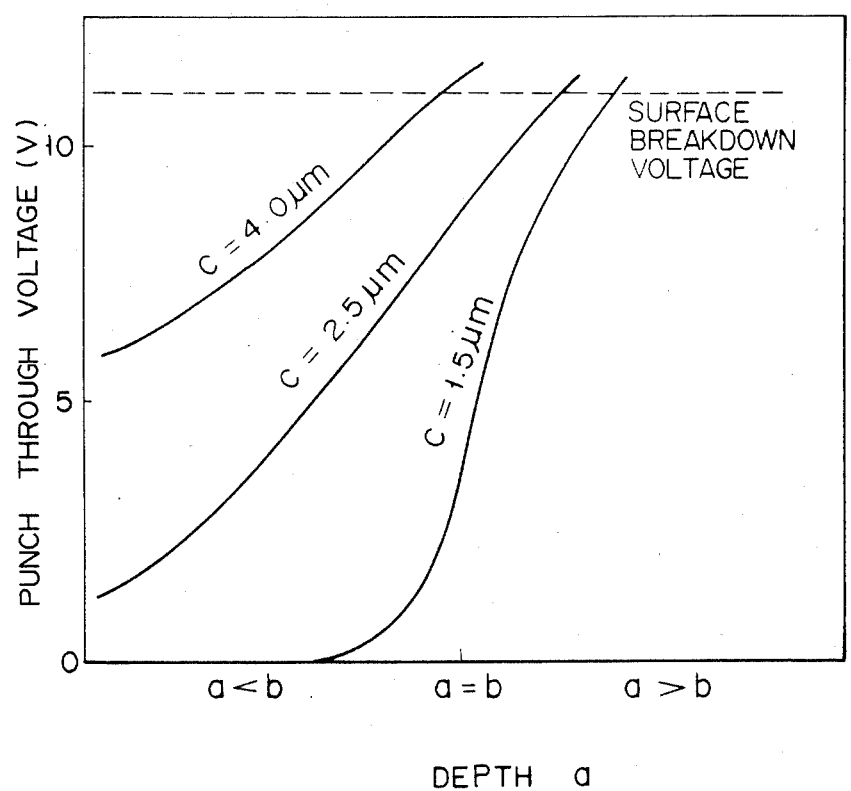
FIG. 4 is a graph for explaining the relationship between the depth of an element isolation region and a punch through voltage between memory cells.

If the first groove 22 is formed to be deeper than the second grooves 28a and 28b, the punch through phenomenon between memory cells can be effectively prevented. FIG. 4 is a graph which shows a punch through voltage between the second grooves 28a and 28b in the above structure and which is obtained from a simple simulation. Assume that the resistivity of a substrate 10 is 10 Ω-cm, and a surface concentration of an inversion preventing layer formed under the first groove 22 is $2 \times 10^{16}$ cm$^{-1}$. The depth of the first groove 22 is given to be a, the depth of the second grooves 28a and 28b, is given to be b and a distance between the second grooves 28a and 28b, is given to be c. A punch through voltage is defined as the voltage produced when a current of $10^{-10}$ A flows between the memory cells. As is apparent from FIG. 4, if a≧b, that is, the depth of the first groove 22 in the element isolation region is formed to be deeper or equal to that of the second grooves 28a and 28b in the memory capacitor region, a high punch through voltage can be obtained even if the distance c between the memory cells is short. Although FIG. 4 shows results obtained from a simple simulation, substantially the same effect as described above was experimentally confirmed.

A third embodiment of a manufacturing method of a semiconductor memory device according to the present invention will be described below with reference to FIGS. 5A to 5G.

Figure 5A:
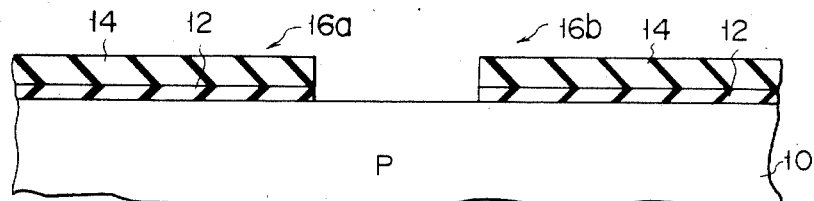
FIGS. 5A to 5G are sectional views of a semiconductor substrate for explaining a method of manufacturing a semiconductor memory device according to a third embodiment of the present invention.
Figure 5B:
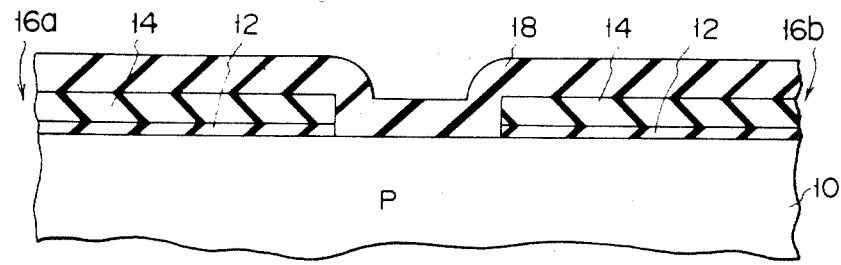

As shown in FIG. 5A, a multilayer formed of, for example, a silicon oxide film 12 and a silicon nitride film 14 is formed on a p-type substrate 10. This multilayer is patterned in a predetermined form, thereby forming first masks 16a and 16b on an element forming region. This patterning is preferably performed by anisotropic dry etching such as RIE, ion-milling or sputtering. A thickness of the multilayer is 0.3 to 1 μm, but is not limited to this.

Figure 5C:
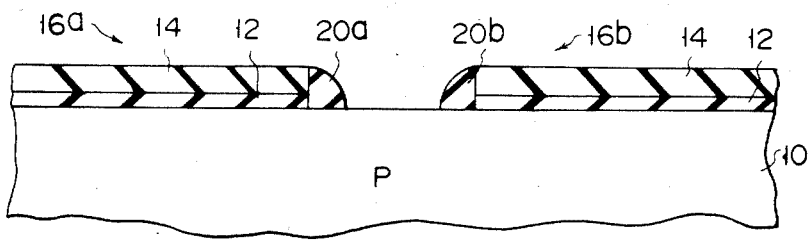

Subsequently, a CVD-SiO$_2$ film 18, for example, is deposited on an entire surface of the resultant structure to have a thickness of 0.3 to 0.5 μm. Then, the entire surface of the thus formed CVD-SiO$_2$ film 18 is etched by RIE using CF$_4$ and H$_2$, so that second masks 20a and 20b having a width of 0.3 to 0.5 μm are respectively left only around the first masks 16a and 16b (FIG. 5C). Note that the first masks 16a and 16b and the second masks 20a and 20b must be respectively formed of materials having different etching characteristics.

Figure 5D:
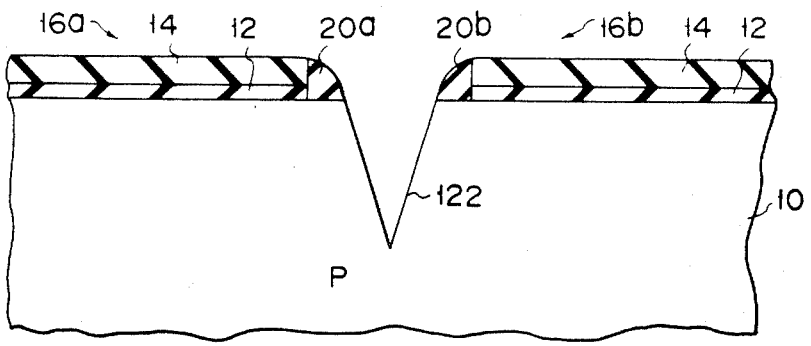

As shown in FIG. 5D, the silicon substrate 10 is taper-etched by RIE using Cl$_2$ and hydrocarbon C$_x$H$_y$ with the first masks 16a and 16b and the second masks 20a and 20b as an etching mask so as to form a first groove 122 having a depth of 1 to 2 μm in the element isolation region. The first groove 122 is defined by two surfaces inclined with respect to the major surface of the structure. In order to form the first groove 122, a wet-etching method using KOH can be used instead of a taper-etching method by RIE. An inversion preventing layer is formed on a surface of the first groove 122.

Figure 5E:
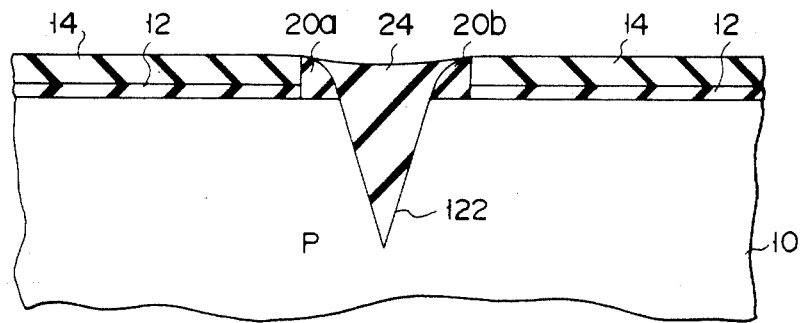

Then, as shown in FIG. 5E, a CVD-SiO$_2$ film 24 is buried in the first groove 122. This burying step can be performed using a flattening technique which exploits etch-back, but is not limited to this. In addition, the silicon substrate 10 can be thermally oxidized to form an SiO$_2$ film.

Figure 5F:
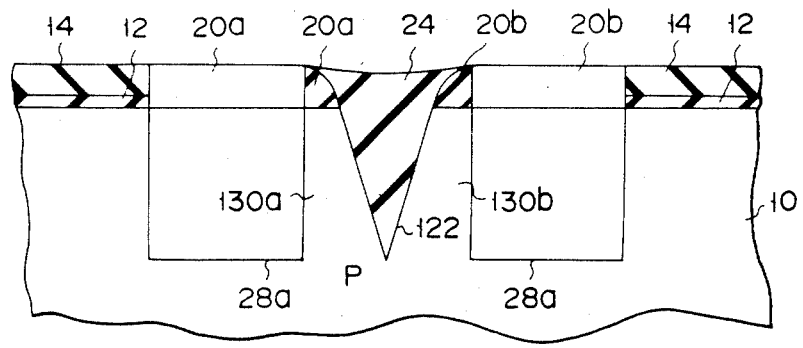

The silicon nitride film 14 is selectively removed by plasma etching using CF$_4$ and O$_2$. Then, the SiO$_2$ film 12, which has been formed under the silicon nitride film 14 in a memory capacitor region, is selectively removed by etching using NH$_4$F or RIE. The substrate 10 is etched by RIE using the remaining silicon nitride film 14, the SiO$_2$ film 12, the second masks 20a and 20b, and the CVD-SiO$_2$ film 24 as an etching mask so as to form second grooves 28a and 28b (FIG. 5F). As is apparent from the figures, the second grooves 28a and 28b in the memory capacitor forming region and the first groove 122 in the element isolation region are isolated from each other by thin silicon walls 130a and 130b which are self-aligned by the second masks 20a and 20b.

Figure 5G:
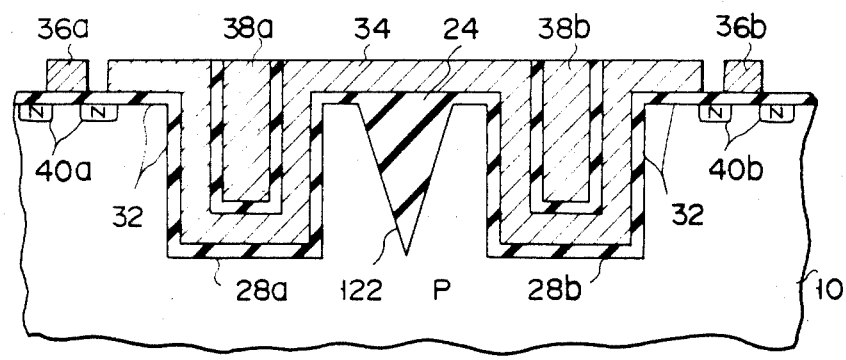
Figure 6A:
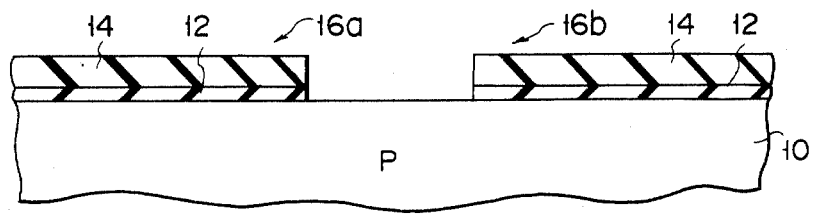
FIGS. 6A to 6G are sectional views of a semiconductor substrate for explaining a method of manufacturing a semiconductor memory device according to a fourth embodiment of the present invention.
Figure 6B:
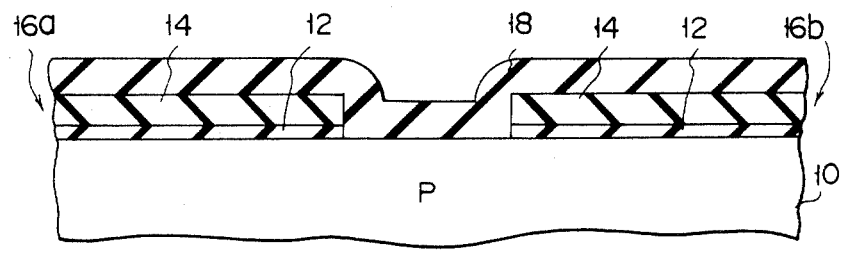
Figure 6C:
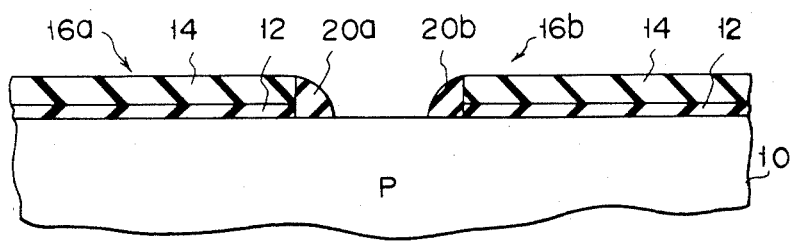
Figure 6D:
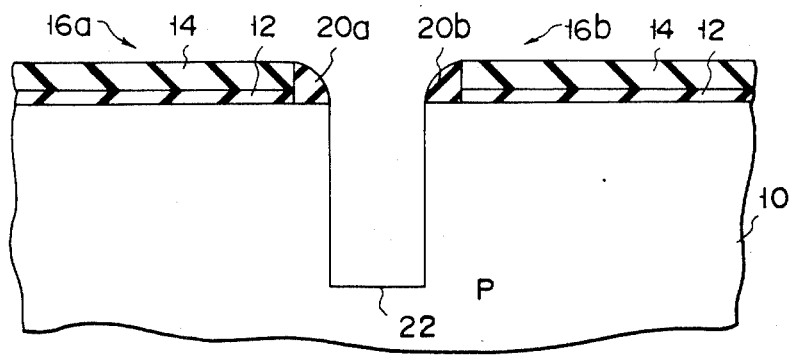
Figure 6E:
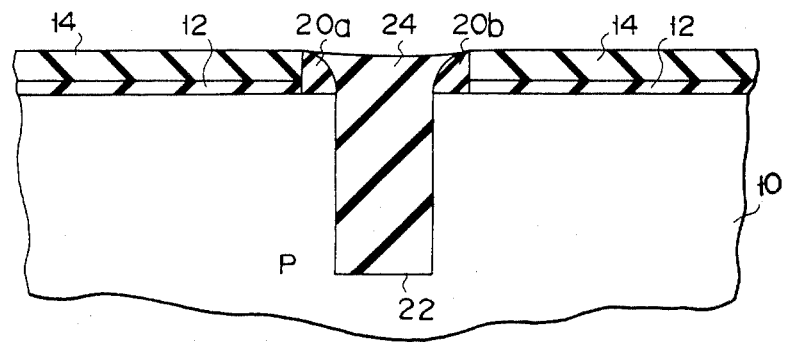
Figure 6F:
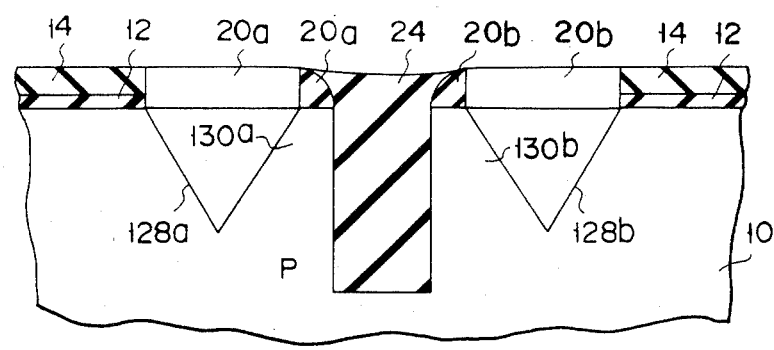
Figure 6G:
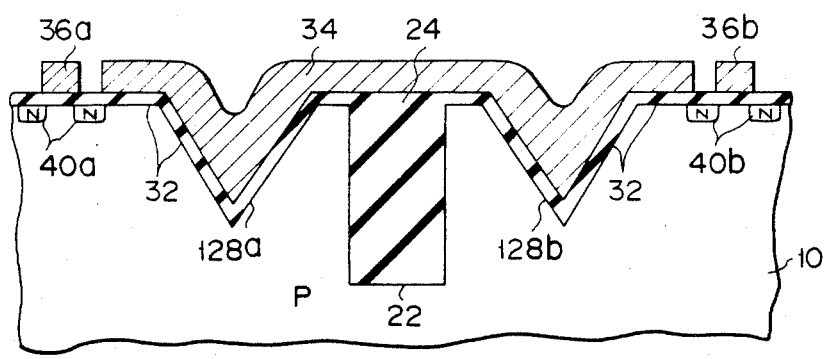
Figure 7A:
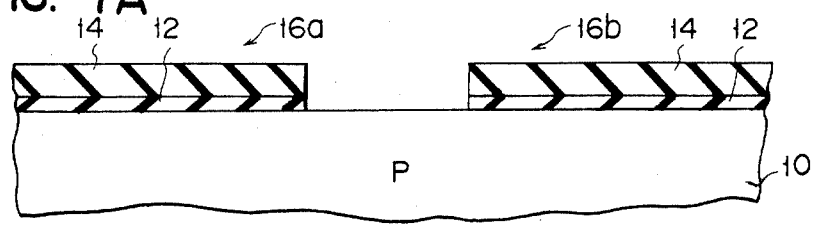
FIGS. 7A to 7G are sectional views of a semiconductor substrate for explaining a method of manufacturing a semiconductor memory device according to a fifth embodiment of the present invention.
Figure 7B:
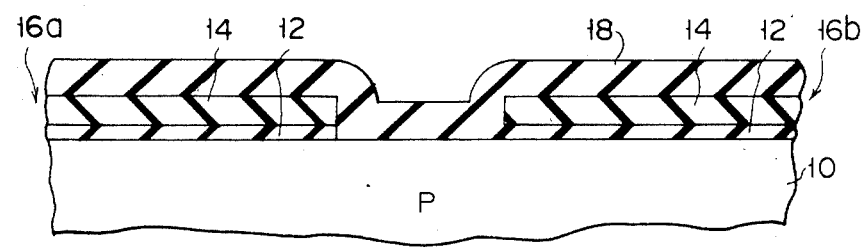
Figure 7C:
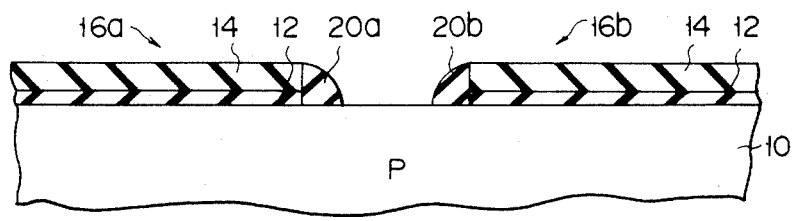
Figure 7D:
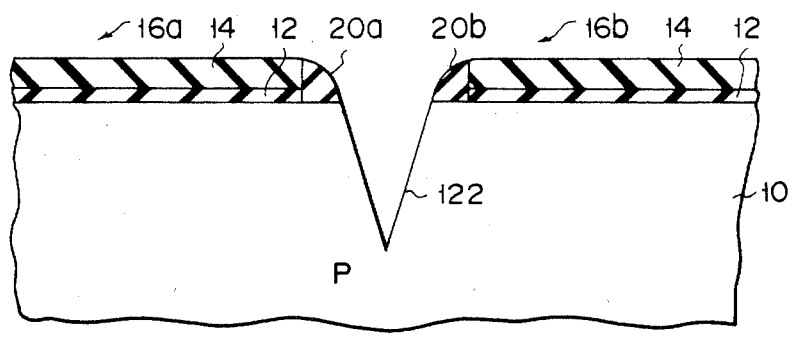
Figure 7E:
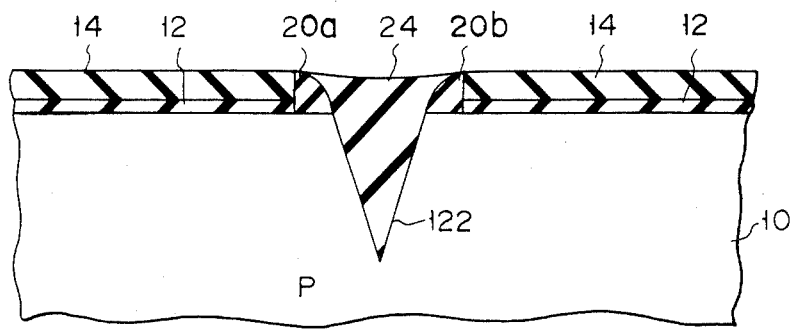
Figure 7F:
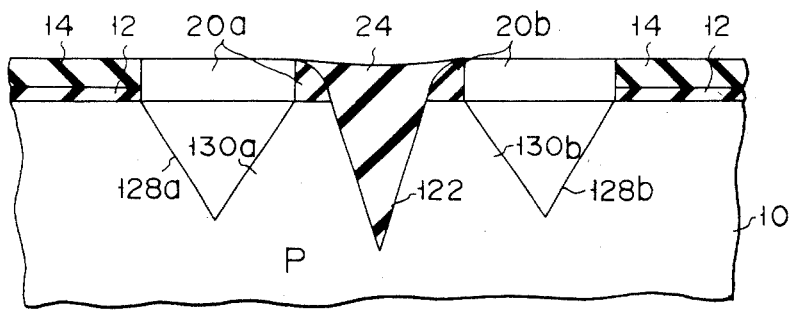
Figure 7G:
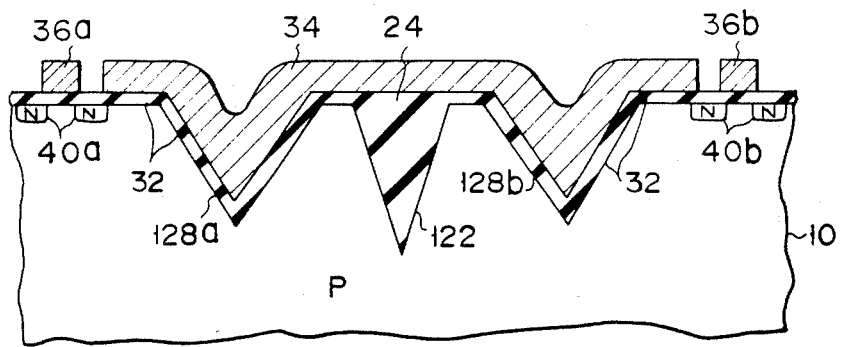

Thereafter, as shown in FIG. 5G, the silicon nitride film 14, the SiO$_2$ film 12, and the second masks 20a and 20b are removed, and a polysilicon film is deposited on the element forming region through a gate insulation film 32 formed of a thermal oxide film. Then, the polysilicon film is patterned to form a capacitor electrode 34. Thereafter, gate electrodes 36a and 36b of a switching transistor coupled to a memory capacitor are formed. Arsenic is ion-implanted at an acceleration voltage of 50 KeV and a dose of $10^{15}$ to $10^{16}$ cm$^{-2}$ using the gate electrodes 36a and 36b and the capacitor electrode 34 as a mask, thereby forming n-type layers 40a and 40b which respectively serve as source and drain regions of the switching transistor. After forming the capacitor electrode 34, polysilicon layers 38a and 38b are buried in recessed portions formed in the memory capacitor region.

When the first groove 122 having such inclined surface is formed, ion-implantation for preventing inversion can be easily performed in the element isolation region. In addition, when the inclined surfaces are formed as in this embodiment, element isolation characteristics are further improved. This is because a high potential barrier with respect to electrons is formed in this portion.

A fourth embodiment of a manufacturing method of a semiconductor memory device, according to the present invention, will now be described with reference to FIGS. 6A to 6G. In this embodiment, a memory capacitor portion is defined by grooves 128a and 128b having inclined surfaces. A groove of an element isolation region is a groove 22 having a surface perpendicular to the major surface of the structure. Since the rest of the structure is substantially the same as that of the third embodiment, the same reference numerals as in the third embodiment denote the same parts in this embodiment and a detailed description thereof is omitted. According to this embodiment, since ion-implantation or diffusion into the memory capacitor portion can be easily performed, a Hi-C cell having a large capacitance can be easily formed.

A fifth embodiment of a manufacturing method of a semiconductor memory device, according to the present invention, will now be described with reference to FIGS. 7A to 7G. In this embodiment, both a first groove 122 and second grooves 128a and 128b consist of grooves having inclined surfaces. Since the rest of the structure is the same as that of the third embodiment, the same reference numerals as in the third embodiment denote the same parts in this embodiment and a detailed description thereof is omitted. In this embodiment, the same effect as that of the third and fourth embodiments can be obtained.

The present invention is not limited to the above embodiments. The insulation material buried in the first groove 22 or 122 is not limited to an SiO$_2$ film. Furthermore, a polycrystalline silicon layer electrically coupled to the capacitor electrode may be buried in the first groove of the element isolation region through the SiO$_2$ film, if a device is used under conditions which do not cause inversion in the silicon substrate corresponding to the surface of the first groove.

What is claimed is:

1. A method of manufacturing a semiconductor memory device having a trench memory capacitor comprising the steps of:

forming a first mask in an element forming region of a semiconductor substrate formed of said element forming region and an element isolation region;

depositing a film formed of a material different from that of said first mask on an entire surface of the resultant structure, and etching said film by anisotropic dry etching so as to leave said film around said first mask as a second mask;

selectively etching said semiconductor substrate using said first and second masks as an etching mask so as to form a first groove in said element isolation region;

burying an insulation film in said first groove;

etching said first mask at least above a memory capacitor forming region in said element forming region so as to form a third mask on a portion excluding said memory capacitor forming region;

selectively etching said semiconductor substrate by using said second and third masks and said insulation film buried in said first groove as an etching mask so as to form a second groove in said memory capacitor forming region, thereby defining the distance between said first and second grooves by said second mask in a self-alignment manner; and forming a capacitor electrode in said second groove through a gate insulation film.

2. A method according to claim 1, wherein said first groove is formed in a V-shape.

3. A method according to claim 1, wherein said second groove is formed in a V-shape.

4. A method according to claim 1, wherein said first groove is formed to be deeper than said second groove.

5. A method according to claim 1, wherein the step of forming said second groove comprises the substeps of removing said first mask, forming a resist for covering said element forming region except for said memory capacitor forming region, and selectively etching said semiconductor substrate using said resist, said second mask and said insulation film buried in said first groove as an etching mask so as to form said second groove.

6. A method according to claim 1, wherein the step of forming said second groove comprises the substeps of selectively removing a portion of said first mask corresponding to said memory capacitor forming region, and selectively etching said semiconductor substrate using a remaining portion of said first mask, said second mask and said insulation film buried in said first groove as an etching mask so as to form said second groove.

* * * * *